United States Patent [19]

Batey et al.

[11] Patent Number: 4,998,152
[45] Date of Patent: Mar. 5, 1991

[54] THIN FILM TRANSISTOR

[75] Inventors: John Batey, Croton; Rajiv V. Joshi, Yorktown Heights, both of N.Y.

[73] Assignee: International Business Machines Corporation, Armonk, N.Y.

[21] Appl. No.: 474,203

[22] Filed: Jan. 24, 1990

Related U.S. Application Data

[63] Continuation of Ser. No. 171,605, Mar. 22, 1988, abandoned.

[51] Int. Cl.$^5$ .................. H01L 29/78; H01L 27/12; H01L 45/00; H01L 49/02
[52] U.S. Cl. .................. 357/23.7; 357/23.1; 357/4
[58] Field of Search .................. 357/4, 23.1, 23.7

[56] References Cited

U.S. PATENT DOCUMENTS

| | | | |
|---|---|---|---|
| 3,234,007 | 2/1966 | Blocher, Jr. et al. | 75/0.5 AB |
| 3,671,820 | 6/1972 | Haering et al. | 357/23.7 |
| 3,881,242 | 5/1975 | Nuttall et al. | 29/58 |
| 4,032,328 | 6/1977 | Hurd | 75/84.1 R |
| 4,445,266 | 5/1984 | Mai et al. | 29/571 |
| 4,477,277 | 10/1984 | D'Altilia et al. | 75/0.5 B |
| 4,502,204 | 3/1985 | Togashi et al. | 357/4 |
| 4,503,601 | 3/1985 | Chiao | 29/571 |
| 4,540,607 | 9/1985 | Tsao | 427/253 |
| 4,552,783 | 11/1985 | Stoll et al. | 427/91 |
| 4,584,207 | 4/1986 | Wilson | 427/124 |
| 4,587,710 | 5/1986 | Tsao | 29/571 |
| 4,595,608 | 6/1986 | King et al. | 427/237 |
| 4,597,001 | 6/1986 | Bortscheller et al. | 357/23.7 |
| 4,609,930 | 9/1986 | Yamazaki | 357/23.7 |
| 4,617,087 | 10/1986 | Iyer et al. | 156/643 |
| 4,619,034 | 10/1986 | Janning | 357/23.7 |
| 4,631,563 | 12/1986 | Iizuka | 357/23.1 |

FOREIGN PATENT DOCUMENTS

| | | |
|---|---|---|
| 0197531 | 10/1986 | European Pat. Off. . |
| 0329482 | 8/1989 | European Pat. Off. . |
| 0218169 | 12/1983 | Japan .................. 357/23.7 |

OTHER PUBLICATIONS

Kaanta et al., "Submicron Wiring Technology with Tungsten and Planarization", IEDM 87-209.
Davori et al., "Submicron Tungsten Gate MOSFET with 10 mm Gate Oxide", 1987 Symposium on VSLI Technology, Digest of Technical Papers, pp. 61-62, IEEE-87.

*Primary Examiner*—Eugene R. LaRoche
*Assistant Examiner*—Michael B. Shingleton
*Attorney, Agent, or Firm*—Scully, Scott, Murphy & Presser

[57] ABSTRACT

Thin film field effect transistors are disclosed having direct or near direct contact of the source and drain electrodes to the channel region. Inverted gate and non-inverted gate types are fabricated by forming metallic source and drain electrodes within a layer of semiconductor material in contact with the channel region. The electrodes are formed by converting monocrystalline, polycrystalline or amorphous silicon regions to a refractory metal such as tungsten by using a non-self-limiting metal hexafluoride reduction process. The tungsten conversion process is isotropic and provides self-alignment of the source and drain electrodes with the gate in the non-inverted gate TFT. The process is low temperature, allowing the use of amorphous silicon as the semiconductor material. The transistors are especially useful for formation on large glass substrates for fabricating large flat panel displays.

20 Claims, 4 Drawing Sheets

THIN FILM TRANSISTOR

This application is a continuation, of application Serial No. 171,605, filed 3/22/88.

BACKGROUND OF THE INVENTION

This invention relates to thin film transistors and more particularly, to amorphous silicon, thin film field effect transistors having metallic source/drain regions with low resistance.

Thin film transistor technology is now the preferred technology for use in active element addressing of large area flat panel displays A plurality of switching elements each made up of a thin film transistor are formed on an insulating substrate in a matrix configuration. The matrix of thin film transistors are used as switching elements for pixels in liquid crystal, electroluminescence and electrochromic flat panel display devices. In the manufacture of flat panel displays, the cost of silicon or quartz substrates is quite high. This is especially true for large displays having dimensions greater than 14 inches Thus, in order to reduce manufacturing costs, simple glass substrates have been investigated to replace silicon. However, the use of glass may present a problem when polysilicon is used as a semiconductor material in the thin film transistor. Typically, polysilicon requires deposition temperatures of 600° C. which may adversely affect the glass to the point where it would begin to melt. For this reason, amorphous silicon is being widely researched as a semiconductor layer in the thin film transistors with glass substrates. The amorphous silicon layer is formed by plasma enhanced chemical vapor deposition techniques at temperatures of 350° C. or less, which can generally be tolerated by the glass. Nevertheless, several drawbacks have developed in the fabrication of the prior art thin film amorphous silicon transistors. One of the main difficulties in this technology is the formation of low resistance metallic contacts to the intrinsic amorphous silicon region. A second problem that has arisen is with regard to the series resistance associated with the bulk amorphous silicon. The aforementioned and other drawbacks of the prior art devices will be more fully described with reference to FIGS. 1 and 2.

FIG. 1 is a cross-sectional view of an inverted gate thin film transistor 10 having a substrate 12 and a metal gate 14 disposed thereon. An insulator layer 16 is disposed on the substrate 12 and gate 14. A layer of semiconductor material 18 is disposed on the insulator layer 16. A second insulator layer 20 is disposed on the semiconductor layer 18 and source and drain electrodes 22 and 24 are deposited in vias etched in the insulator layer 20.

The thin film transistor shown in FIG. 1 operates as an inverted gate field effect transistor by applying a voltage to the gate electrode 14. The application of the voltage causes a channel, indicated at 26, to be formed between the source electrode 22 and drain electrode 24 at the interface of the insulator layer 16 and the semiconductor layer 18. In the inverted gate structure of FIG. 1, the source and drain contacts 22, 24 are spaced from the channel 26 by a distance equal to the semiconductor layer thickness, which is generally in the range of 2000 angstroms. This spacing represents a significant additional resistance on the order of several meg ohms in the transistor which adversely affects device performance. In the prior art, the formation of the source and drain electrodes within the semiconductor layer could only be accomplished with the high temperature processes of ion implantation and diffusion. As stated above, high temperatures are not desirable when using glass substrates. In addition, if amorphous silicon is used as the semiconductor material, the resulting device would not function since the high temperatures involved in the ion implantation and diffusion would drive off the included hydrogen and the properties of the amorphous silicon would be lost.

FIG. 2 shows a cross-sectional view of a non-inverted gate thin film transistor having a glass substrate 28 and a semiconductor layer 30 disposed thereon. Source and drain contacts 32 and 34 are deposited on the semiconductor layer 30 and a gate insulator layer 36 is deposited over the semiconductor layer 30 and source and drain contacts 32 and 34. A metallic gate electrode 38 is deposited on the insulator layer 36 to complete the device. Similar channel contact problems exits in the device of FIG. 2 as corner field effects inhibit contact and increase the resistance.

In addition, the fabrication of thin film FETs requires an alignment of the gate with the source and drain electrodes. As shown in FIG. 2, a portion of the gate 38 overlaps the source and drain electrodes. Critical alignment steps are necessary to ensure the gate sufficiently overlaps the source and drain electrode. This overlap is necessary in order to provide high transconductance between the source and drain electrodes. However, the source to gate and drain to gate overlaps are limited in extent to prevent the formation of large source to gate and drain to gate capacitances, which would create undesirable parasitic capacitances.

Accordingly, optimum FET performance has been achieved through stringent alignment of the metal electrode to the source and drain electrodes. This is especially true in the fabrication of a display system where small parasitics cannot be tolerated. In a practical manufacturing environment, such a stringent alignment requirement is not easily complied with. Alignment for devices formed on large glass substrates are particularly difficult as the glass tends to warp during processing so that transistors aligned on one area of the substrate will be misaligned on another area of the substrate. As a consequence, a typical manufacturing yield of a batch of thin film FETs tends to be lower than desirable.

Moreover, as with the device of FIG. 1, attempts to build devices having the source an drain formed within the semiconductor layer than encroach beneath the gate have been unsuccessful when using amorphous silicon on a glass substrate. Encroachment is effected by ion implantation by diffusion which destroys the amorphous silicon properties.

SUMMARY OF THE INVENTION

The present invention is directed to a thin film field effect transistors in which the source an drain electrodes make direct contact with the channel region. In addition, the invention is directed a thin film field effect transistors having self-aligned source and drain electrodes with the gate electrode. The unique features of the invention are disclosed in both inverted gate and non-inverted gate type FETs. In addition, the invention is directed to a novel method of fabricating the inventive devices in which source and drain electrodes are formed within the semiconductor layer of a metallic material.

The thin film inverted gate FET of the present invention comprises a gate electrode layer disposed on a substrate. A first insulator layer is disposed on the substrate and the gate electrode. A semiconductor layer is disposed on the insulator layer and source and drain electrodes are formed within the semiconductor layer that substantially contact the channel region above the gate. The source and drain electrodes are spaced apart in the region above the gate electrode. The source and drain electrodes are formed by a unique metal reduction process that will be described in detail hereinafter. A second insulator layer is disposed on the semiconductor layer extending across the region between the source and drain electrodes. The inverted gate thin film FET of the invention overcomes the deficiencies of the prior art. In operation, upon switching on the channel by a suitable gate voltage, the direct or near direct contact of the source and drain electrodes to the channel region of high electron concentration results in a significant reduction in the resistance.

The non-inverted thin film FET of the present invention comprises a semiconductor layer disposed on a substrate. The gate insulator layer is disposed on a semiconductor layer and the gate electrode layer is disposed on the gate insulator layer. Source and drain electrodes are formed within the semiconductor layer such that the source and drain electrodes are spaced apart in a portion of the region below the gate insulator layer. As with the inverted gate transistor described above, the non-inverted gate thin film FET of the invention overcomes the deficiencies of the prior art in that the contact afforded by the source and drain regions to the channel should be of a suitably low resistance once the channel is switched on.

The source and drain electrodes, for both the inverted and non-inverted gate thin film FETs of the invention are fabricated by using a metal hexafluoride gas reduction process to convert the source and drain regions of the semiconductor layer in each device to a refractory metal. Specifically, the process utilized is that disclosed in U.S. Patent Application Serial No. 157,026 of R.V. Joshi (hereinafter referred to as the Joshi process), one of the co-inventors herein. The aforementioned Joshi application has been assigned to the same assignee as the present application and is incorporated herein by reference. The Joshi process is a non-self-limiting refractory metal reduction process whereby a semiconductor layer is exposed to a metal hexafluoride gas under conditions of flow rate, pressure and temperature sufficient to render the reaction no longer self-limiting. In accordance with the process, silicon, whether in a monocrystalline, polycrystalline or amorphous state, can be converted to a metal such as tungsten, in accordance with the reaction:

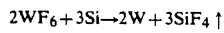

$$2WF_6 + 3Si \rightarrow 2W + 3SiF_4 \uparrow$$

Pursuant to the Joshi process, by adjusting the chemical vapor deposition conditions under which the $WF_6$ gas is exposed to the silicon, such as flow rate, pressure and temperature, a thickness of semiconductor material larger than at which the reaction was previously known to be self-limiting, can now be completely converted to tungsten. The reaction can be performed at low temperatures, such as 350° C. or less, and the resulting tungsten will have relatively low, resistivity. Alternatively, the good control which can be achieved by this process can be used to stop the reaction after a predetermined depth of conversion. Thus, in the case of the inverted gate thin film FET, the electrodes may be formed in the semiconductor layer while leaving a small buffer region separating the channel. This near direct contact will avoid possible high field of problems in the gate-insulator-source/drain regions, but still maintain good channel contact. In addition, the reaction is essentially 100% selective in that insulator materials such as $SiO_2$ and $Si_3N_4$ do not react at all and can be used as a mask for delineation.

The use of the Joshi process to form the source and drain electrodes within the semiconductor layer of the structures results in self-aligned source to gate and drain to gate overlaps. Portions of the semiconductor material on both sides of the channel region are completely converted to tungsten. In carrying out the conversion, the tungsten is caused to encroach under the gate oxide because the conversion is isotropic, i.e., the conversion of silicon to tungsten goes as wide as it does deep. In this way, the width of the channel region can be easily controlled. No expedients, such as gate sidewalls, are required since the silicon is directly converted to tungsten in a self-aligned manner.

The direct channel contact and self-aligned TFTs of the present invention are made possible by the use of the Joshi low temperature, non-self limiting process. This is especially advantageous in the fabrication of a matrix of active elements for flat panel displays utilizing glass substrates which tend to distort during device fabrication. Thus, the effective yield of the thin film FETs in accordance with the invention is greatly increased over the prior art.

DESCRIPTION OF THE PREFERRED EMBODIMENTS

The present invention is directed to thin film field effect transistors of both the inverted gate and non-inverted gate type which have direct or near direct contact of the source and drain electrodes to the channel region. In addition, in fabricating one type of thin film FET of the invention, the source and drain electrodes are formed within the semiconductor layer by a method which provides self-alignment with the gate electrode. The direct or near direct contact with the channel region significantly reduces the series resistance present in prior art devices thereby enhancing device performance. The self-alignment significantly reduces production costs especially when several hundred thin film FETs of the invention are fabricated on a large glass substrate for use in a flat panel display.

The fabrication of the thin film transistors (TFT) of the present invention utilizes the aforementioned Joshi non-self-limiting metal hexafluoride reduction process. This process, disclosed in U.S. Patent Application Serial No. 157,026, and incorporated herein by reference, converts semiconductor material to a refractory metal in a CVD process by exposing the semiconductor to a metal hexafluoride gas under conditions of flow rate, pressure and temperature sufficient to render the reaction non-self-limiting. Thus, in accordance with the Joshi process, thicknesses of silicon, whether monocrystalline, polycrystalline, or amorphous, greater than the thickness at which the reduction process was heretofore known to be self-limiting, may be fully converted to a refractory metal such as tungsten in accordance with the reaction:

$$2WF_6 + 3Si \rightarrow 2W + 3SiF_4 \uparrow \quad (1)$$

Figure 1:
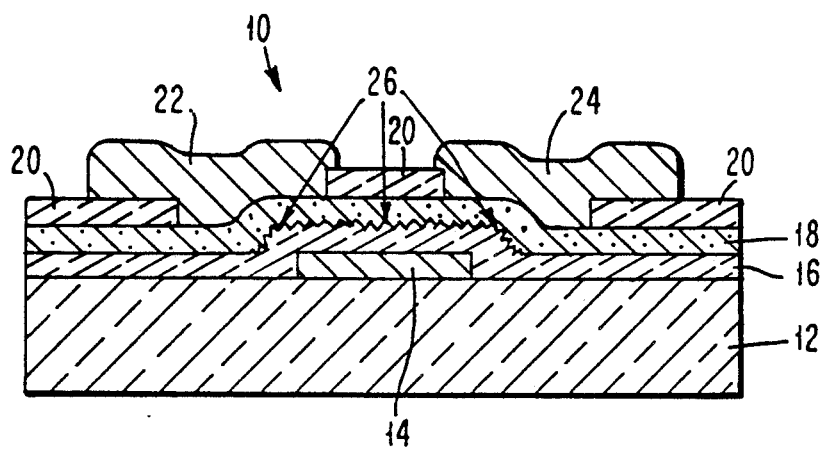
FIG. 1 is a schematic cross-sectional view of a prior art inverted gate thin film field effect transistor.
Figure 2:
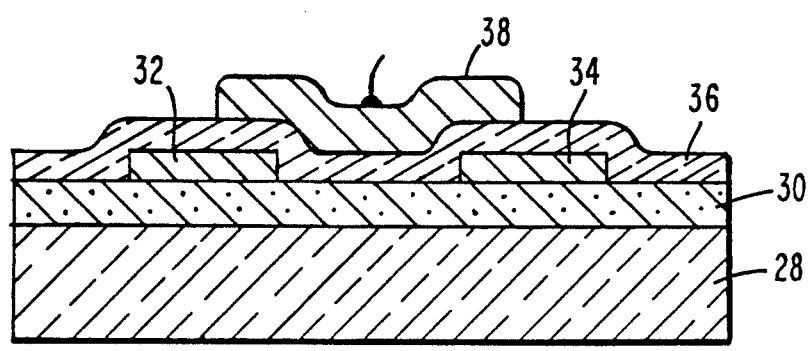
FIG. 2 is a schematic cross-sectional view of a prior art thin film non-inverted gate field effect transistor.
Figure 3A:
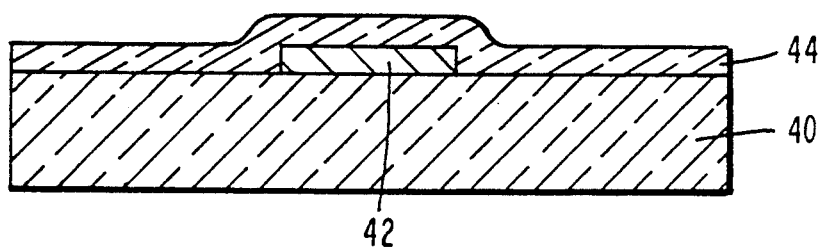
FIGS. 3a–3d are schematic cross-sectional views of an inverted-gate thin film FET of the present invention showing sequentially the major fabrication steps.

Referring now to the drawings, FIGS. 3a-3d, show the basic fabrication steps for forming an inverted gate TFT of the present invention. As shown in FIG. 3a, an insulating substrate 40 is provided with a metal gate 42 and a insulator layer 44 disposed on the substrate 40 and the gate 42. The insulating substrate 40 may be made of any undoped semiconductor material or of glass, such as Corning 7059. The metal gate pattern is defined by standard techniques such as by sputtering or evaporation and photolithography. Any metal suitable for operating as a gate conductor may be utilized, such as, Mo, Ni, Cr, NiCr, Al, CrCu, and MoTa. The insulator layer 44 is deposited thereon by any known deposition method, such as chemical vapor deposition.

Figure 3B:
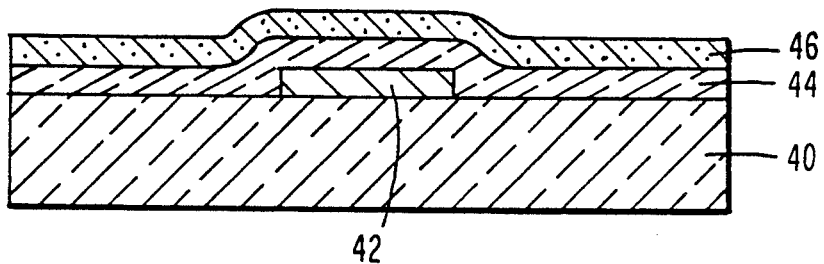

As shown in FIG. 3b, a layer of semiconductor material 46 is deposited onto the insulator layer 44. The semiconductor layer is also deposited by standard deposition techniques. The semiconductor material in the illustrative embodiment of the present invention is made of silicon and may be in a monocrystalline state, a polycrystalline state or an amorphous state. For purposes of fabricating a large flat panel display, where the substrate 40 is made of glass, the preferred material for semiconductor layer 46 is amorphous silicon. Amorphous silicon is deposited by using silane gas and hence the layer 46 will be hydrogenated. This deposition can take place in temperatures of 350° C. or less which are conditions favorable to the glass substrate.

Figure 3C:
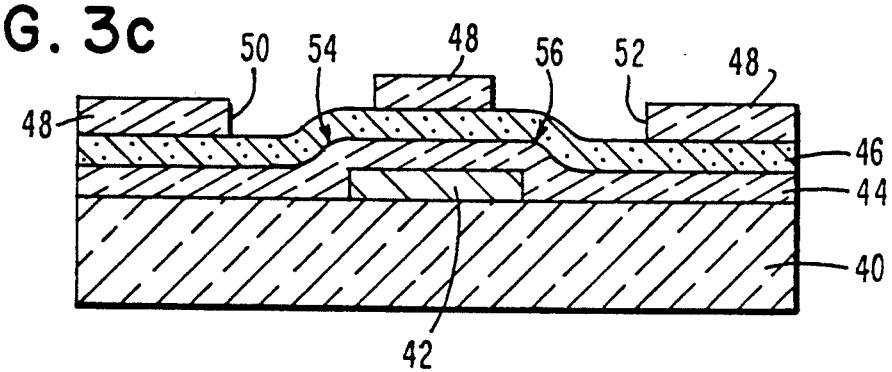
Figure 3D:
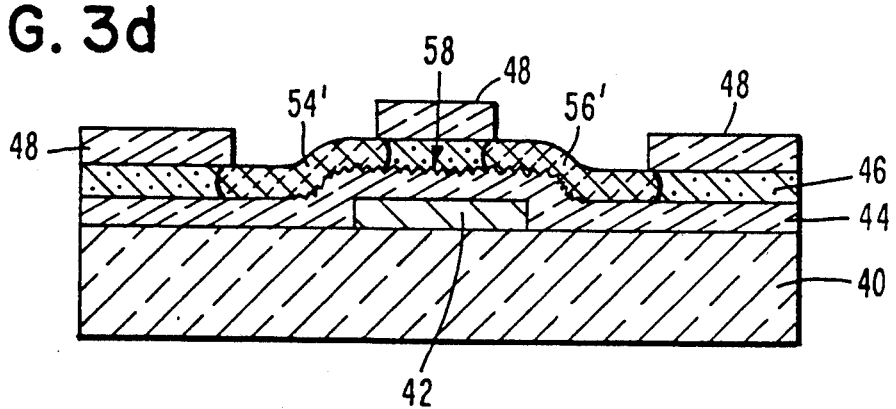

As shown in FIG. 3c, a second layer of insulator material 48 is deposited on the semiconductor layer 46 and vias 50 and 52 are etched by any known technique such as dry or wet etching to expose source and drain regions 54 and 56 of the semiconductor layer 46. The structure shown in FIG. 3c is then exposed to the metal hexafluoride gas in accordance with the aforementioned Joshi process to selectively convert the regions 54 and 56 to a refractory metal. In the illustrative embodiment of the invention as shown in FIG. 3d, the regions 54 and 56 are fully converted to the refractory metal, such as tungsten, so that the regions form source and drain electrodes 54' and 56' that contact the channel region 58. A portion of the layer 46 extending over the metal gate 42 will be converted to tungsten as shown in FIG. 3d. The thickness of the layers may vary widely pursuant to the particular application. As the Joshi process is non-self limiting, there is no limitation on the thickness of the semiconductor material to be converted.

Figure 3E:
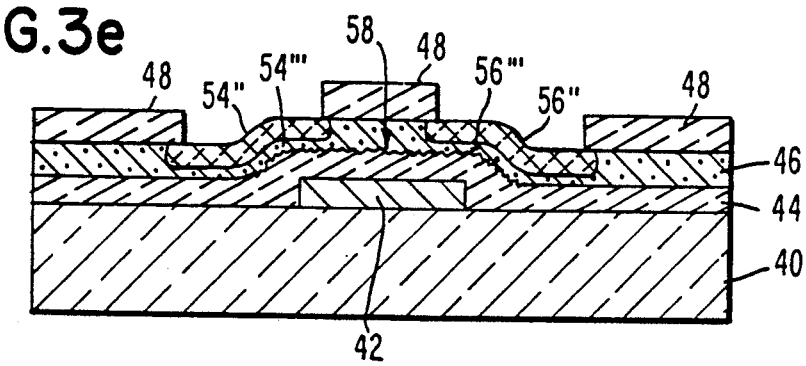
FIGS. 3e–3h are schematic cross-sectional views of an inverted gate thin film FET of the present invention showing alternative embodiments of fabrication.

Alternatively, the depth of conversion of the regions 54 and 56 may be controlled by adjusting process parameters including the time of the reaction to stop the reaction after a predetermined depth of conversion. As shown in FIG. 3e, a spacing 54''' and 56''' is provided between the refractory metal electrodes 54'' and 56'' and the channel region 58. This spacing should be less than 500 angstroms and may be as small as 100 angstroms. The spacing would avoid possible high field problems in the gate insulator-source/drain regions while still maintaining good channel contact.

In operation, once the channel is switched on by a suitable gate voltage, the direct or near direct contact by the refractory metal electrodes to the channel region of high electron concentration will result in a suitably low resistance. The resistance will be substantially less than the 4 meg ohms of the prior art device described above. Depending on the application and thickness of material converted to the metal source/drain electrodes, the resistance will be reduced to negligible amounts. By eliminating the spacing in the prior art TFTs between the source and drain electrodes and the channel region in the amorphous silicon semiconductor layer, the bulk resistance of the amorphous silicon is no longer a significant factor. Thus, the use of the Joshi process to form the source and drain electrodes within the amorphous silicon layer significantly enhances device performance.

Figure 3F:
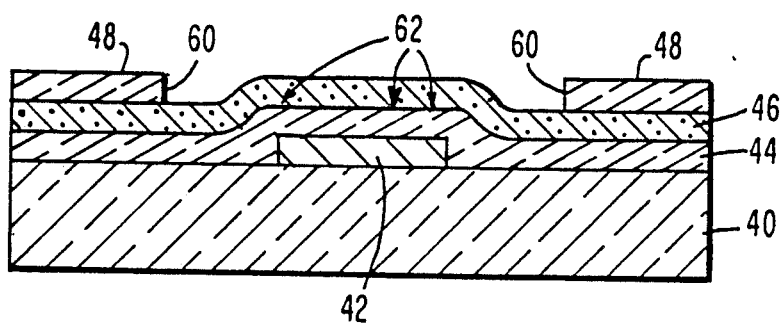
Figure 3G:
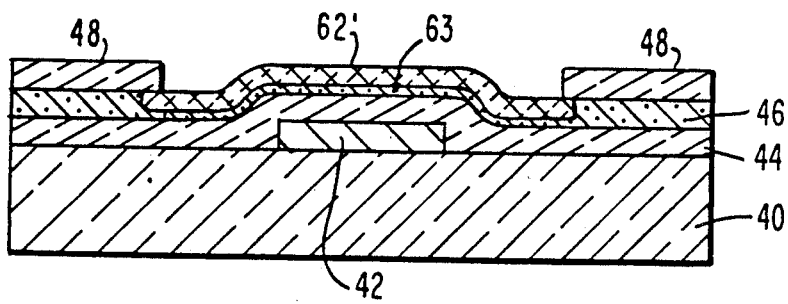
Figure 3H:
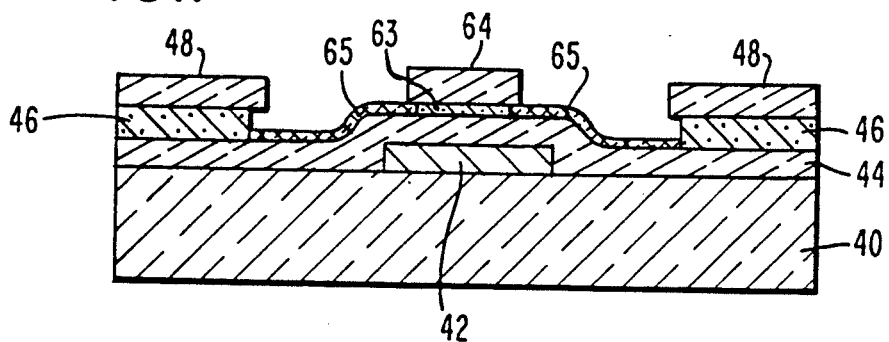

An alternative embodiment is shown in FIGS. 3f-3h wherein after the device of 3b is formed, one large area via 60 is etched as shown in FIG. 3f. The entire substrate is then exposed to the refractory metal hexafluoride gas in accordance with the Joshi process to convert less than the full depth of the region 62 to the refractory metal 62'. As shown in FIG. 3g, an unconverted region 63 remains amorphous silicon All of the metallic region 62' is then etched away and an insulator layer 64 is deposited above the gate 42. The remaining exposed unconverted amorphous silicon region 63 is converted by the Joshi process to a refractory metal 65, such as tungsten, as shown in FIG. 3h. Thus, the remaining amorphous silicon region 63 in the device is selectively thinner thereby reducing adverse photoconductivity effects. In addition, the thickness of amorphous silicon 46, surrounding the device, remains at the original thickness which is desirable in a flat panel display application to prevent short circuiting of the gate metal.

Figure 4A:
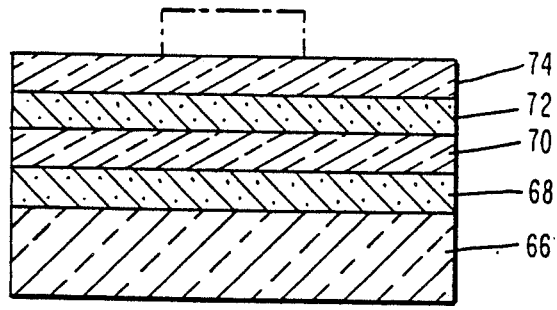
FIGS. 4a–4c are schematic cross-sectional views of a non-inverted thin film FET of the present invention showing sequentially the major fabrication steps.
Figure 4B:
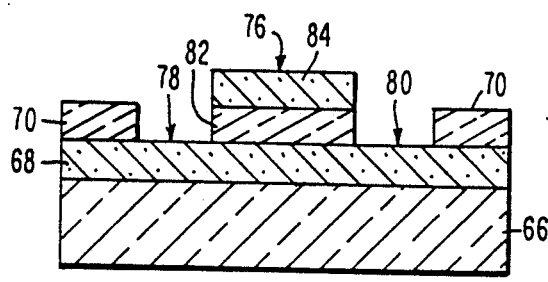
Figure 4C:
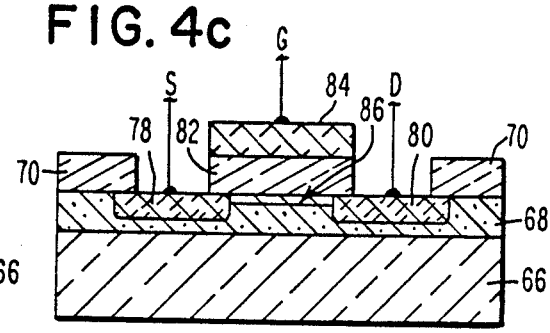

FIGS. 4a-4c show the basic fabrication steps for forming a non-inverted gate TFT of the present invention. As shown in FIG. 4a, an insulating substrate 66 is provided and the layers 68 of semiconductor material, layer 70 of insulating material, layer 72 of semiconductor material and layer 74 of insulator material are all deposited sequentially by standard deposition techniques. The stacked structure of FIG. 4a may be formed sequentially by plasma enhanced CVD in a single pump down. Subsequently, as shown in FIG. 4b, a multilayer gate region 76 is defined together with source and drain regions 78 and 80 on either side of the gate region 76. Typically, two photolithographic steps are required to define the gate, source and drain regions There is no requirement that the alignment of these regions be critical and large tolerances can be built in. In the illustrative embodiment shown in FIG. 4b, the gate region 76 includes an insulating layer 82 disposed on the semiconductor layer 68 and a layer 84 of semiconductor material disposed on the insulating layer 82. As noted above, the insulating layers may be one of $SiO_2$ or $Si_3N_4$ and the semiconductor layers may be crystalline or amorphous silicon. The insulating substrate may be any intrinsic semiconductor or a glass.

The structure of FIG. 4b is then exposed to the refractory metal hexafluoride gas in accordance with the aforementioned Joshi process under suitable conditions such that both the gate layer 84 and the source and drain regions 78 and 80 are converted simultaneously to the refractory metal. As shown in FIG. 4c, under reaction 1, layer 84 and regions 78 and 80 are converted to tungsten Due to the selectivity of the reaction, the conversion of the gate layer 84 to tungsten will stop naturally at the gate insulating layer 82 interface. The depth of the source and drain conversion can further be determined by time exposure The conversion process is isotropic and proceeds laterally as well as vertically. Thus, a portion of the semiconductor material 68 under the insulator layer 82 will be converted to the refractory metal so that the process will provide self-aligned overlapping source and drain regions with the metal gate. The extent of the overlap will depend upon the depth of conversion of the source and drain regions Typically, the overlap is in the order of one micron but can potentially be made as small as 1,000 angstroms. The self-alignment of the source and drain electrodes with the metal gate provides the proper alignment without the need for a expensive and time consuming optical alignment techniques presently employed when depositing the metal gates in the prior art devices This is especially useful when fabricating a multiplicity of TFTs on a large scale (greater than 14 inches) flat panel display matrix arrangement In addition, the direct contact of the refractory metal source and drain electrodes 78 and 80 to the channel region 86 results in a suitably low resistance once the channel is switched on, which, depending on the application, may be reduced to near zero.

Figure 5A:
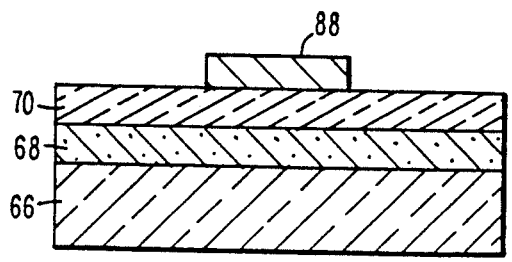
FIGS. 5a and 5b are schematic cross-sectional views of a non-inverted gate thin film FET of the present invention showing sequentially the major fabrication steps of an alternative embodiment.
Figure 5B:
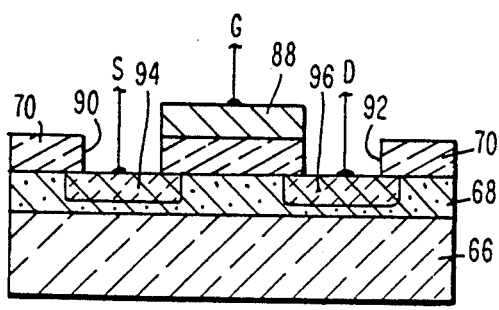

FIGS. 5a and 5b show an alternative method for fabricating the non-inverted gate TFT of the invention. A semiconductor layer 68 and an insulator layer 70 are deposited onto the glass substrate 66 by PECVD. A metal gate 88 is formed on the insulator 70 by sputtering or evaporation. Typical gate metals are the same as described above for the metal gate of the inverted gate structure. As shown in FIG. 5b, the metal gate 88 is then used as an etch mask to etch the source and drain vias 90 and 92 The structure is then exposed to the Joshi process and regions 94 and 96 are selectively converted to the refractory metal The self-aligned process is highly desirable and possibly even necessary in the fabrication of large area flat panel displays utilizing TFT technology The thin film field effect transistors of the invention have a direct or near direct contact of the metallic source and drain electrodes to the channel region, which substantially reduces the series resistance of the transistors. The reduction in resistance significantly enhances device performance The enhanced performance greatly increases the range of applications of the TFTs of the invention especially for use in flat panel displays.

While the invention has been particularly shown and described with respect to preferred embodiments thereof, it will be understood by those skilled in the art that the foregoing and other changes in form and detail may be made therein without departing from the spirit and scope of the invention which should be limited only by the scope of the appended claims.

What is claimed is:

1. A thin film inverted gate, field effect transistor comprising:
   a gate electrode layer disposed on a substrate;
   a first insulating layer disposed on said substrate and said gate electrode;
   a semiconductor layer disposed on said insulator layer;
   source and drain electrodes formed within said semiconductor layer, said electrodes comprising a refractory metal formed in place of all or a part of the semiconductor layer, said source and drain electrodes being spaced apart in the region above said gate electrode;
   a second insulator layer disposed on said semiconductor layer extending across the region between said source and drain electrodes.

2. The thin film transistor of claim 1 wherein the semiconductor layer is one of a monocrystalline state, a polycrystalline state and an amorphous state.

3. The thin film transistor of claim 2 wherein the semiconductor layer is made of amorphous silicon.

4. The thin film transistor of claim 2 wherein the semiconductor layer is made of polycrystalline silicon.

5. The thin film transistor of claim 2 wherein the semiconductor layer is made of monocrystalline silicon.

6. The thin film transistor of claim 2 wherein the source and drain electrodes formed within the semiconductor layer contact the first insulator layer.

7. The thin film transistor of claim 2 wherein the source and drain electrodes formed within the semiconductor layer are spaced from said first insulator layer by a thin layer of said semiconductor layer.

8. The thin film transistor of claim 7 wherein the spacing between the source and drain electrodes and the first insulator layer is in the range between 100 to 500 angstroms.

9. The thin film transistor of claim 8 wherein the space between the source and drain electrodes and the first insulator layer is about 100 angstroms.

10. The thin film transistor of claim 2 wherein the source and drain electrodes are formed within said semiconductor layer by a reduction reaction with a hexafluoride of said refractory metal and said semiconductor layer, said refractory metal being formed substantially free of the semiconductor material of said semiconductor layer.

11. The thin film transistor of claim 10 wherein the refractory metal is tungsten.

12. The thin film transistor of claim 11 wherein the substrate is glass.

13. A thin film field effect transistor comprising:
   a semiconductor layer disposed on a substrate;
   a gate insulator disposed on said semiconductor layer;
   a gate electrode layer disposed on said gate insulator layer; and
   source and drain electrodes formed within said semiconductor layer, said electrodes comprising a refractory metal formed in place of all or a part of the semiconductor layer, said source and drain electrodes being spaced apart in a portion of the region below said gate insulator layer.

14. The thin film transistor of claim 13 wherein the semiconductor layer is one of a monocrystalline state, a polycrystalline state and an amorphous state.

15. A thin film transistor of claim 13 wherein the semiconductor layer is made of amorphous silicon.

16. The thin film transistor of claim 14 wherein the semiconductor layer is made of polycrystalline silicon.

17. The thin film transistor of claim 14 wherein the semiconductor layer is made of monocrystalline silicon.

18. The thin film transistor of claim 14 wherein the source and drain electrodes are formed within said semiconductor layer by a reduction reaction with a hexafluoride of said refractory metal and said semiconductor layer, said refractory metal being formed with substantially no trace of the semiconductor material of said semiconductor layer.

19. The thin film transistor of claim 8 wherein the refractory metal is tungsten.

20. The thin film transistor of claim 9 wherein the substrate is glass.

* * * * *

UNITED STATES PATENT AND TRADEMARK OFFICE
CERTIFICATE OF CORRECTION

PATENT NO. : 4,998,152

DATED : March 5, 1991

INVENTOR(S) : John Batey, et al.

It is certified that error appears in the above-identified patent and that said Letters Patent is hereby corrected as shown below:

Column 8, lines 48-50, Claim 10: "formed substantially free of the" should read as --formed with substantially no trace of the--.

Signed and Sealed this

Sixth Day of October, 1992

Attest:

DOUGLAS B. COMER

Attesting Officer

Acting Commissioner of Patents and Trademarks